United States Patent
Kishimoto

(10) Patent No.: US 10,924,083 B2
(45) Date of Patent: Feb. 16, 2021

(54) PIEZOELECTRIC DEVICE AND METHOD FOR MANUFACTURING PIEZOELECTRIC DEVICE

(71) Applicant: Murata Manufacturing Co., Ltd., Nagaokakyo (JP)

(72) Inventor: Yutaka Kishimoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 455 days.

(21) Appl. No.: 15/448,633

(22) Filed: Mar. 3, 2017

(65) Prior Publication Data
US 2017/0179925 A1    Jun. 22, 2017

Related U.S. Application Data

(63) Continuation of application No. PCT/JP2015/079116, filed on Oct. 15, 2015.

(30) Foreign Application Priority Data

Oct. 27, 2014 (JP) ................................. 2014-218430

(51) Int. Cl.
*H03H 9/17* (2006.01)
*H03H 3/02* (2006.01)
*H03H 9/02* (2006.01)

(52) U.S. Cl.
CPC .............. *H03H 9/174* (2013.01); *H03H 3/02* (2013.01); *H03H 9/0222* (2013.01);
(Continued)

(58) Field of Classification Search
CPC ........ H03H 9/174; H03H 3/02; H03H 9/0222; H03H 9/173; H03H 9/175; H03H 2003/023

See application file for complete search history.

(56) References Cited

U.S. PATENT DOCUMENTS

2004/0140869 A1    7/2004  Marksteiner et al.
2004/0174090 A1*   9/2004  Koshido ............... H03H 3/08
                                                310/313 R
(Continued)

FOREIGN PATENT DOCUMENTS

JP    2002-270410 A    9/2002
JP    2004-129223 A    4/2004
(Continued)

OTHER PUBLICATIONS

Official Communication issued in International Patent Application No. PCT/JP2015/079116, dated Dec. 15, 2015.

*Primary Examiner* — Bryan P Gordon
(74) *Attorney, Agent, or Firm* — Keating & Bennett, LLP

(57) ABSTRACT

In a method of manufacturing a piezoelectric device in which a piezoelectric thin film on which functional conductors are formed is fixed to a support substrate by a fixing layer, an alignment mark is formed on one main surface of a light-transmitting piezoelectric substrate. A sacrificial layer is formed on a main surface of the piezoelectric substrate with reference to the alignment mark and the fixing layer is formed so as to cover the sacrificial layer and is bonded to the support substrate. The piezoelectric thin film is formed by being separated from the piezoelectric substrate and the functional conductors are formed on the surface of the piezoelectric thin film with reference to the alignment mark. The piezoelectric device is able to be manufactured while positions of formation regions of conductors are adjusted efficiently.

9 Claims, 6 Drawing Sheets

(52) U.S. Cl.
CPC ............ *H03H 9/173* (2013.01); *H03H 9/175* (2013.01); *H03H 2003/021* (2013.01); *H03H 2003/023* (2013.01); *H03H 2003/025* (2013.01)

(56) References Cited

U.S. PATENT DOCUMENTS

| | | | |
|---|---|---|---|
| 2004/0232802 A1* | 11/2004 | Koshido | H03H 9/0547 310/348 |
| 2005/0012571 A1 | 1/2005 | Song et al. | |
| 2005/0269495 A1* | 12/2005 | Kakemizu | B82Y 35/00 250/234 |
| 2012/0205754 A1* | 8/2012 | Iwamoto | H03H 3/02 257/415 |
| 2012/0206999 A1* | 8/2012 | Aratake | G04R 20/10 368/47 |
| 2013/0320803 A1* | 12/2013 | Maeda | B81C 1/00293 310/300 |
| 2014/0368089 A1* | 12/2014 | Omomo | H03H 9/0519 310/348 |
| 2015/0357555 A1* | 12/2015 | Umeda | H01L 41/316 310/322 |

FOREIGN PATENT DOCUMENTS

| | | |
|---|---|---|
| JP | 2004-129224 A | 4/2004 |
| JP | 2004-159339 A | 6/2004 |
| JP | 2004-357306 A | 12/2004 |
| JP | 2005-303781 A | 10/2005 |
| WO | 2011/052551 A1 | 5/2011 |

\* cited by examiner

PIEZOELECTRIC DEVICE AND METHOD FOR MANUFACTURING PIEZOELECTRIC DEVICE

CROSS REFERENCE TO RELATED APPLICATIONS

This application claims the benefit of priority to Japanese Patent Application No. 2014-218430 filed on Oct. 27, 2014 and is a Continuation Application of PCT Application No. PCT/JP2015/079116 filed on Oct. 15, 2015. The entire contents of these applications are hereby incorporated herein by reference.

BACKGROUND OF THE INVENTION

1. Field of the Invention

The present invention relates to a piezoelectric device including a thin film of piezoelectric single crystal, and a method for manufacturing the piezoelectric device.

2. Description of the Related Art

In recent years, many piezoelectric devices using a thin film of piezoelectric single crystal have been developed. As such a piezoelectric device, there is a piezoelectric device including a piezoelectric thin film on which electrodes functioning as a piezoelectric device are formed and a support body supporting the piezoelectric thin film and employing a membrane structure in which a space is formed between a region including the electrodes and the support body.

International Publication No. 2011/052551 discloses a method for manufacturing a piezoelectric device having a membrane structure. With the manufacturing method disclosed in International Publication No. 2011/052551, a sacrificial layer, which forms a void later, is formed on one surface of a piezoelectric substrate and a support body is bonded to the surface of the piezoelectric substrate on which the sacrificial layer has been formed. Thereafter, a piezoelectric thin film is formed by being separated from the piezoelectric substrate, an etching window is formed in the piezoelectric thin film, and the sacrificial layer is removed using the etching window.

In International Publication No. 2011/052551, when the sacrificial layer is formed before the piezoelectric thin film is formed by being separated from the piezoelectric substrate and a conductor for an electrode is formed after the piezoelectric thin film is formed by separation, adjustment for positioning a region in which the sacrificial layer is formed and a region in which the conductor is formed with each other needs to be performed. However, it is difficult to perform the adjustment for positioning with the manufacturing method disclosed in International Publication No. 2011/052551.

SUMMARY OF THE INVENTION

Preferred embodiments of the present invention provide a piezoelectric device capable of being manufactured while an adjustment to position a conductor formation region is able to be performed efficiently, and a method for manufacturing the piezoelectric device.

A piezoelectric device according to a preferred embodiment of the present invention includes a light-transmitting piezoelectric thin film on which a functional conductor is provided, a support substrate on one main surface side of the piezoelectric thin film, a fixing layer fixing the piezoelectric thin film to the support substrate, and a region formation alignment mark provided between the piezoelectric thin film and the fixing layer and located inside or outside a formation region of the functional conductor when seen from above.

With this configuration, the functional conductor is provided on the piezoelectric thin film with reference to the region formation alignment mark between the piezoelectric thin film and the fixing layer, such that manufacturing of the piezoelectric device while adjusting a position of the formation region of the functional conductor is able to be performed efficiently.

It is preferable that the fixing layer include a void portion provided between the formation region and the support substrate, and the region formation alignment mark be provided in the void portion or an outer side portion of the void portion when seen from above.

With this configuration, when the void portion is formed, the void portion is able to be formed with reference to the region formation alignment mark. Therefore, a position of the void portion is able to be adjusted efficiently with only one type of region formation alignment mark.

It is preferable that the functional conductor be provided on each of one main surface and the other main surface of the piezoelectric thin film.

With this configuration, even when the piezoelectric device is a resonator using plate waves or bulk waves with the conductors provided on both of the main surfaces of the piezoelectric thin film, positions of the conductors which are provided on both of the main surfaces are able to be adjusted efficiently with only one type of region formation alignment mark.

It is preferable that the fixing layer be an acoustic reflection layer including a plurality of types of layers with different acoustic impedances.

With this configuration, even when the piezoelectric device is an acoustic multilayer film resonator, the position of the formation region of the functional conductor is able to be adjusted efficiently.

In a method for manufacturing a piezoelectric device according to another preferred embodiment of the present invention, the piezoelectric device including a piezoelectric thin film on which a functional conductor is formed, a support substrate at one main surface side of the piezoelectric thin film, and a fixing layer fixing the piezoelectric thin film to the support substrate, the method includes forming a region formation alignment mark on one main surface of a light-transmitting piezoelectric substrate, forming an inorganic layer on the one main surface of the piezoelectric substrate, bonding the support substrate to a surface of the inorganic layer at an opposite side to the piezoelectric substrate, forming the piezoelectric thin film by being separated from the piezoelectric substrate, and forming a functional conductor on one main surface of the piezoelectric thin film with reference to the region formation alignment mark.

With this configuration, even after the piezoelectric thin film is formed by separation, a position of the functional conductor is able to be adjusted efficiently by forming the functional conductor on the piezoelectric thin film with reference to the region formation alignment mark.

It is preferable that the method of manufacturing the piezoelectric device according to a preferred embodiment of the present invention include forming a sacrificial layer on the one main surface of the piezoelectric substrate with reference to the region formation alignment mark, wherein the forming of the inorganic layer includes forming the inorganic layer after the sacrificial layer is formed, and the method include forming an etching window in the piezoelectric substrate with reference to the region formation alignment mark, and forming a void layer by removing the sacrificial layer by etching using the etching window.

With this configuration, when the void layer is formed, the void layer is able to be formed with reference to the region formation alignment mark. Therefore, a formation position of the void layer is able to be adjusted efficiently with only one type of region formation alignment mark.

According to preferred embodiments of the present invention, the region formation alignment mark is formed and the functional conductor is formed on the piezoelectric thin film with reference to the region formation alignment mark, thus performing adjustment to position a formation region of the functional conductor efficiently.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
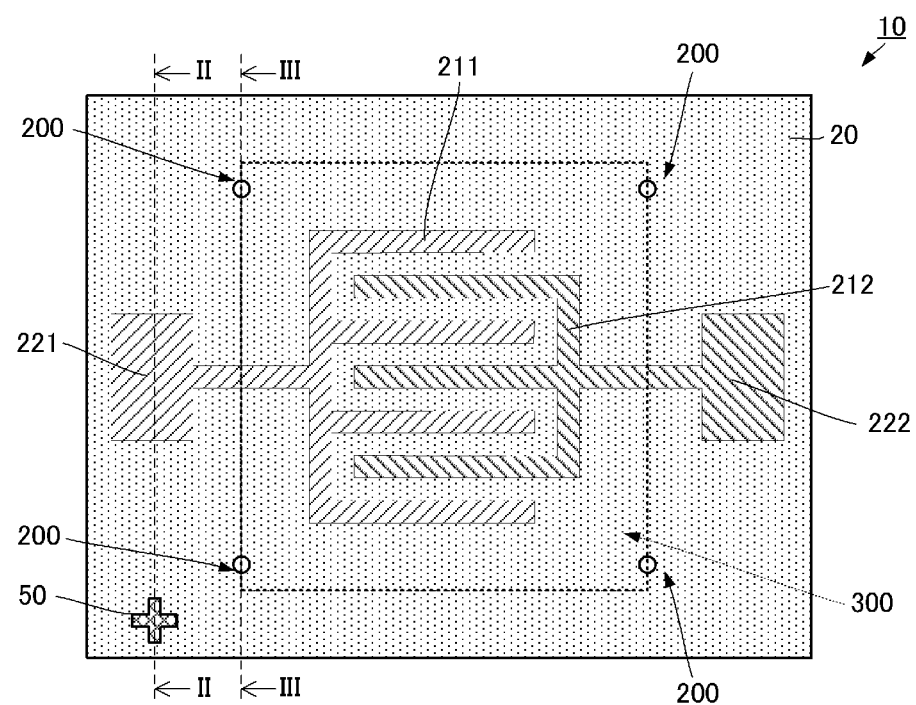
FIG. 1 is a plan view of a piezoelectric device according to a first preferred embodiment of the present invention.
Figure 2:
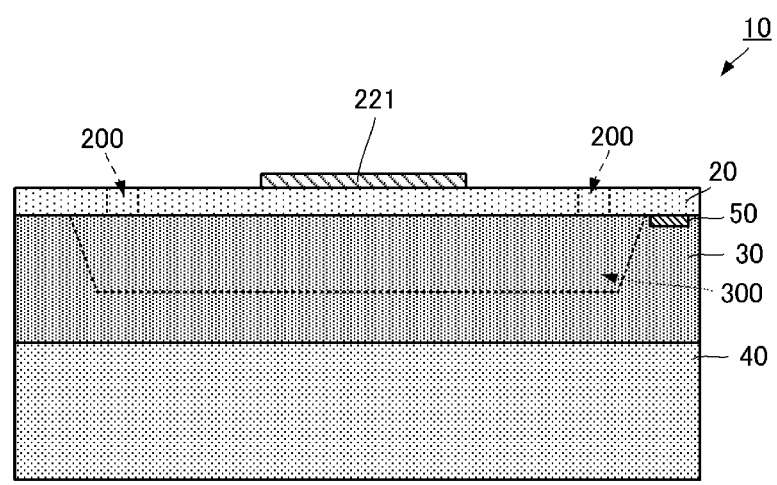
FIG. 2 is a cross-sectional side view of the piezoelectric device along line II-II in FIG. 1.
Figure 3:
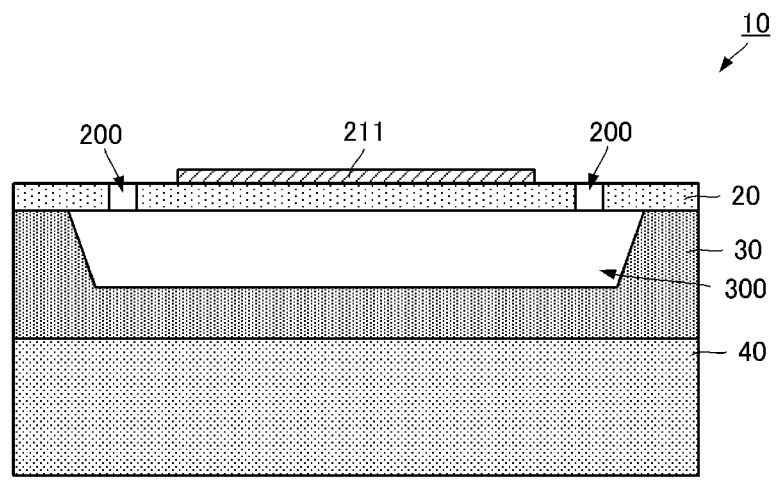
FIG. 3 is a cross-sectional side view of the piezoelectric device along line III-III in FIG. 1.

FIG. 1 is a plan view of a piezoelectric device according to a first preferred embodiment of the present invention. FIG. 2 is a cross-sectional side view of the piezoelectric device along line II-II in FIG. 1. FIG. 3 is a cross-sectional side view of the piezoelectric device along line III-III in FIG. 1. FIG. 1 and FIG. 2 illustrate a state of making a portion of the piezoelectric device transparent and the transparent portion is indicated by dashed lines.

The piezoelectric device 10 preferably includes a piezoelectric thin film 20, a fixing layer 30, and a support substrate 40. The piezoelectric thin film 20 is a light-transmitting piezoelectric body preferably made of $LiNbO_3$ (LN), $LiTaO_3$ (LT), or the like. When the thickness of the piezoelectric body is equal to or smaller than about 3 μm, for example, a light-transmitting property is enhanced and it is therefore more preferable. The fixing layer 30 is an insulating body preferably made of $SiO_2$ or the like. The support substrate 40 is an insulating body preferably made of Si, sapphire, glass, or the like. The light-transmitting property referred herein indicates capability of transmitting not only visible light but also infrared rays, ultraviolet rays, X rays, electron beams, and the like.

The fixing layer 30 and the support substrate 40 are both adhered to one main surface (hereinafter, referred to as a back surface) of the piezoelectric thin film 20 in this order. That is to say, the piezoelectric thin film 20 is fixed to the support substrate 40 by the fixing layer 30. Functional conductors 211 and 212 are preferably provided on the other main surface (hereinafter, referred to as a surface) of the piezoelectric thin film 20. The functional conductors 211 and 212 have comb-teeth shaped portions when seen from above. The functional conductors 211 and 212 are arranged to define a so-called inter digital transducer (IDT). The functional conductors 211 and 212 are at positions overlapping with a void 300, which will be described later, when seen from above. With this configuration, the piezoelectric device is provided.

Wiring conductors 221 and 222 are provided on the surface of the piezoelectric thin film 20. The wiring conductor 221 is connected to the functional conductor 211. The wiring conductor 222 is connected to the functional conductor 212. The wiring conductors 221 and 222 are conductors connecting the functional conductors 211 and 212 to external circuits. The functional conductors 211 and 212 and the wiring conductors 221 and 222 are made of a material having high electrical conductivity, such as Al. Hereinafter, a region in which the functional conductors 211 and 212 are provided is referred to as a functional portion region.

The fixing layer 30 adheres to the piezoelectric thin film 20 so as to surround the functional portion region when seen from above. With this arrangement, the void 300 surrounded by the back surface of the piezoelectric thin film 20 and the inner wall surfaces of the fixing layer 30 is at a position opposing the functional portion region. Through-holes 200 are defined in the piezoelectric thin film 20 and the void 300 communicates with the through-holes 200. The through-holes 200 are utilized to form the void 300 as will be described in detail later.

An alignment mark 50 is provided between the piezoelectric thin film 20 and the fixing layer 30. The alignment mark 50 is provided in an outer side portion relative to the wiring conductors 221 and 222 and the void 300 when seen from above. The alignment mark 50 is utilized in adjusting formation positions of the functional conductors 211 and 212 and the wiring conductors 221 and 222 and adjusting a formation position of the void 300 when the piezoelectric device 10 is manufactured. In other words, the functional conductors 211 and 212, the wiring conductors 221 and 222, and the void 300 are formed while positions thereof are adjusted with reference to the alignment mark 50 when the piezoelectric device 10 is manufactured. The formation positions of the functional conductors 211 and 212, the wiring conductors 221 and 222, and the like are therefore able to be adjusted efficiently. The alignment mark 50 preferably includes, for example, projections which define a cross shape.

Figure 4:
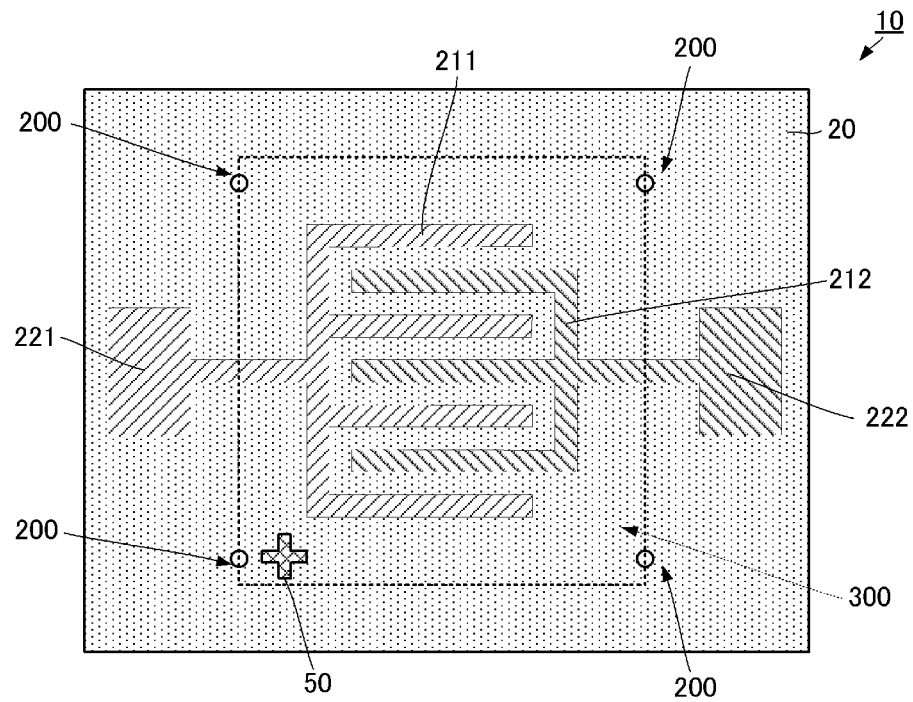
FIG. 4 is a plan view of the piezoelectric device in which an alignment mark is at a different position from that in FIG. 1.

Although the alignment mark 50 is preferably provided in the outer side portion relative to the functional conductors 211 and 212 or the like, the arrangement position thereof is not limited thereto. FIG. 4 is a plan view of the piezoelectric device 10 in which the alignment mark 50 is at a different position from that in FIG. 1. In this example, the alignment mark 50 is provided in an inner side portion of the void 300 when seen from above. It should be noted that the alignment mark 50 may be provided at any desirable position, including in an inner side portion of the functional portion region.

The piezoelectric device 10 having the above-described configuration is preferably formed by the following non-limiting exemplary processes.

Figure 5:
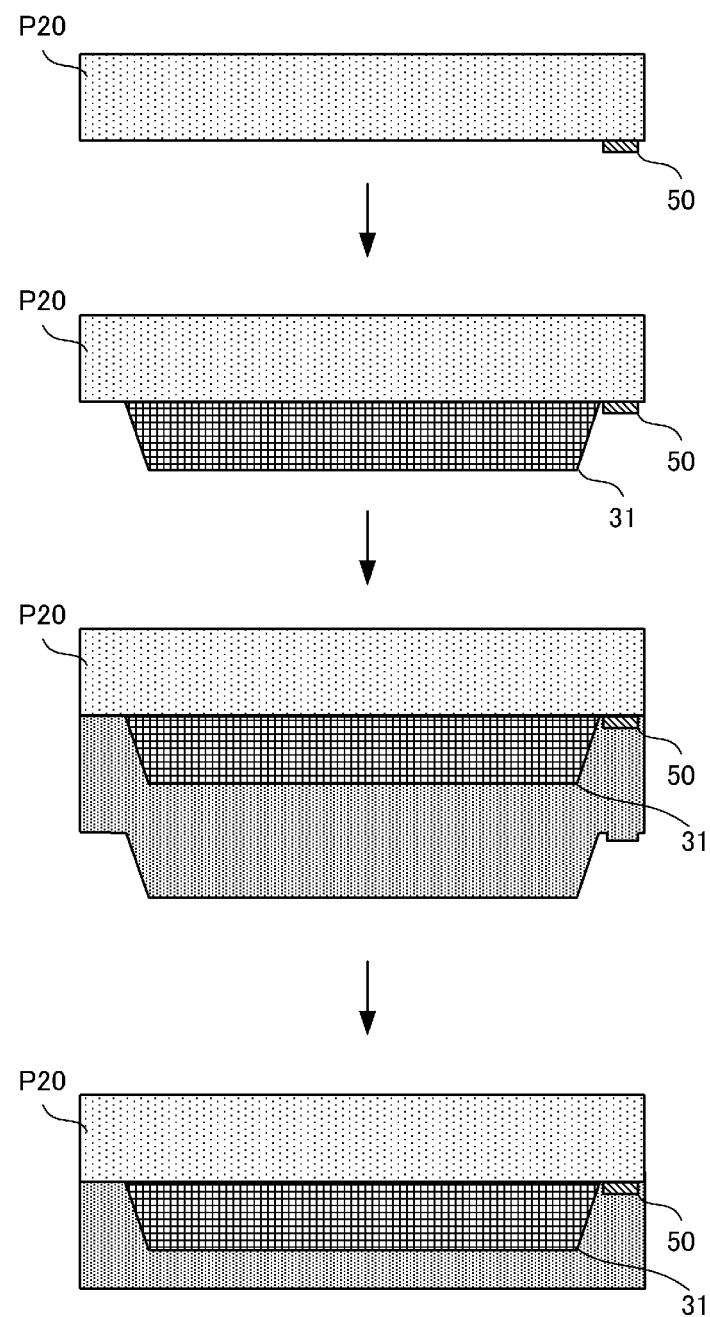
FIG. 5 is a cross-sectional side view illustrating shapes in respective processes in a method of manufacturing a piezoelectric device according to a preferred embodiment of the present invention.
Figure 6:
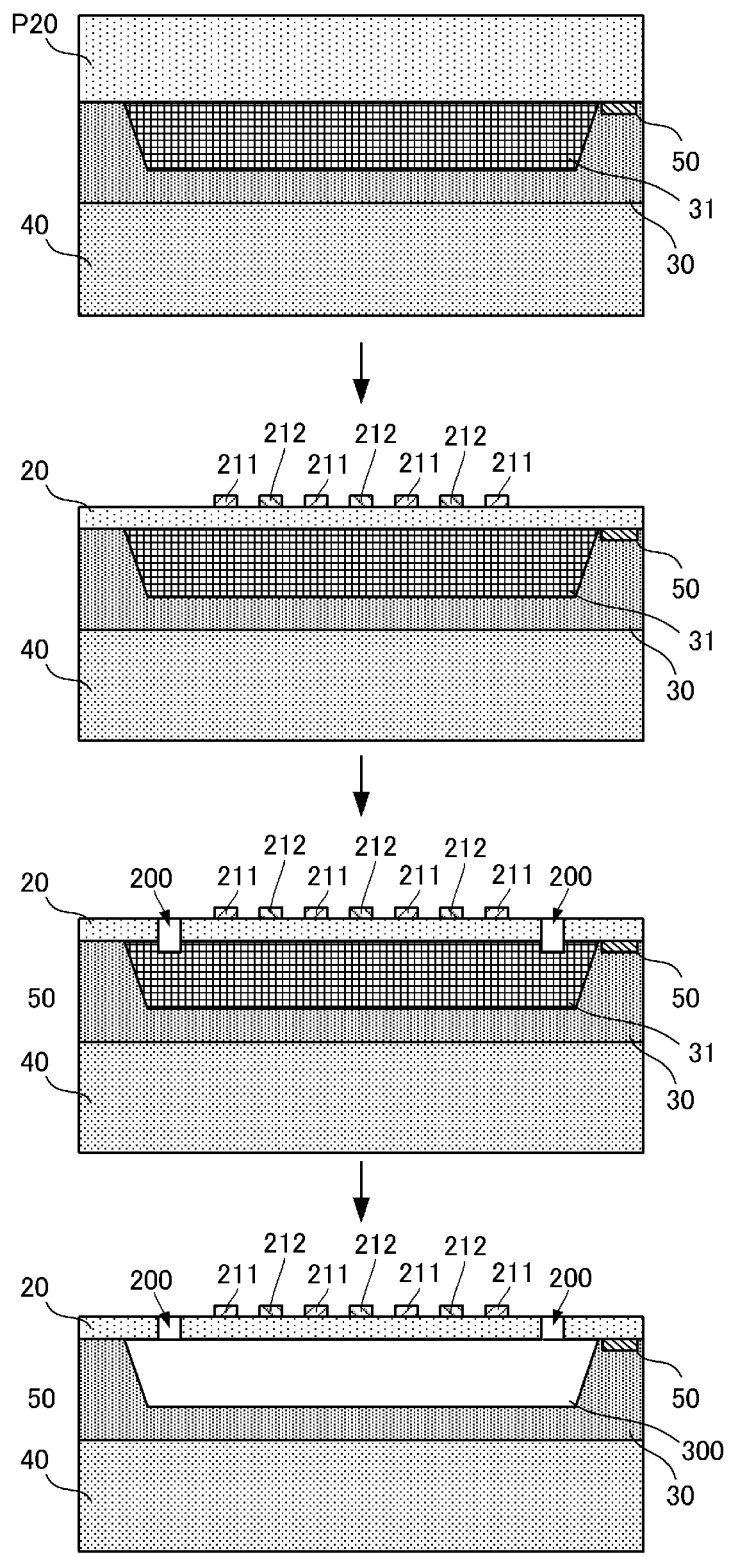
FIG. 6 is a cross-sectional side view illustrating the shapes in the respective processes in a method of manufacturing a piezoelectric device according to a preferred embodiment of the present invention.

FIG. 5 and FIG. 6 are cross-sectional side views illustrating shapes in respective processes in a method of manufacturing the piezoelectric device 10 according to a preferred embodiment of the present invention. The alignment mark 50, the void 300, and the like are illustrated in the same cross-sectional view in FIG. 5 and FIG. 6 for the convenience of explanation.

First, the alignment mark 50 is provided on the back surface of a light-transmitting piezoelectric substrate P20. The alignment mark 50 is preferably film-formed by forming Ti/Al/Ti by a deposition lift-off method. The piezoelectric substrate P20 has light-transmitting property and the alignment mark 50 can therefore be visually recognized from the surface side of the piezoelectric substrate P20 when seen from above. Then, the sacrificial layer 31 is formed on the back surface of the piezoelectric substrate P20 with reference to the alignment mark 50. The sacrificial layer 31 is formed so as to be located in an inner side portion relative to the alignment mark 50. The formation position of the sacrificial layer 31 is adjusted with reference to the alignment mark 50, thus performing the adjustment efficiently. It should be noted that the sacrificial layer 31 is preferably made of, for example, ZnO.

Subsequently, the fixing layer 30 is provided on the back surface of the piezoelectric substrate P20 so as to cover the alignment mark 50 and the sacrificial layer 31. With this, the alignment mark 50 is arranged between the piezoelectric substrate P20 and the fixing layer 30. The fixing layer 30 is formed so as to cover the sacrificial layer 31 and the like. Therefore, irregularities are generated on the surface of the fixing layer 30 at the opposite side to the piezoelectric substrate P20. The surface of the piezoelectric substrate P20 with the irregularities are polished to be flattened by chemical mechanical polishing (CMP).

Subsequently, as illustrated in FIG. 6, the support substrate 40 is adhered to the flattened main surface of the fixing layer 30 with a resin adhesive. Then, the piezoelectric substrate P20 is thinned, preferably by polishing or the like, to form the piezoelectric thin film 20. The functional conductors 211 and 212 are provided on the surface of the formed piezoelectric thin film 20. The functional conductors 211 and 212 are preferably formed by forming Al/Ti by the deposition lift-off method. Although not illustrated in FIGS. 5 and 6, the wiring conductors 221 and 222 are also provided on the surface of the piezoelectric thin film 20 preferably by the deposition lift-off method. In this case, the functional conductors 211 and 212 are formed while positions thereof are adjusted with reference to the alignment mark 50.

Then, the through-holes 200 are formed, preferably by dry etching, in the piezoelectric thin film 20 at predetermined positions with reference to the alignment mark 50. Then, the sacrificial layer 31 is removed using the through-holes 200. The sacrificial layer 31 is preferably removed by wet etching, for example. The void 300 is thus formed in the fixing layer 30 by the above-described processing.

The piezoelectric device 10 is preferably formed by using the above-described manufacturing method, for example. The formation positions of the functional conductors 211 and 212 are able to be adjusted efficiently because the alignment mark 50 is utilized when the piezoelectric device 10 is manufactured. Although only one alignment mark 50 is formed in the present preferred embodiment, the number of alignment marks 50 may be equal to or more than two. It is sufficient that the alignment mark 50 is formed at a position capable of adjusting the positions of the functional conductors 211 and 212, and the like, and the formation position thereof is able to be appropriately changed.

In the preferred embodiments of the present invention, description has been made while the piezoelectric device 10 is configured as a resonator using plate waves. Alternatively, the piezoelectric device may be configured as a BAW resonator or a plate wave resonator, for example.

Figure 7:
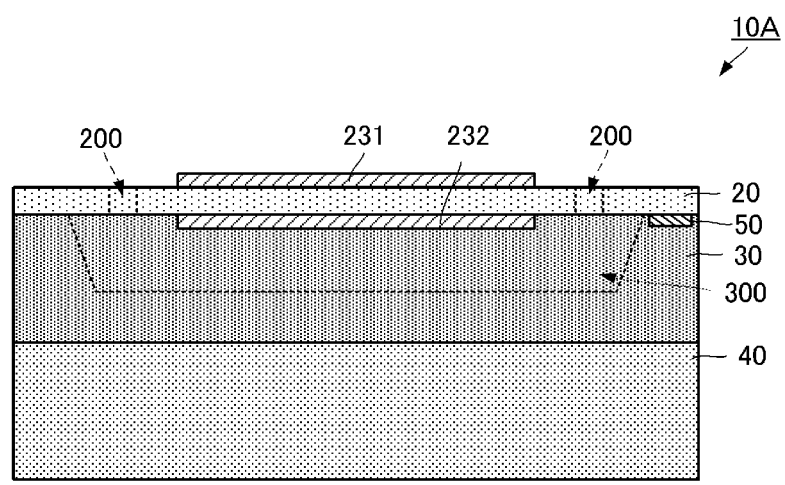
FIG. 7 is a cross-sectional view when the piezoelectric device is a BAW resonator.

FIG. 7 is a cross-sectional view when a piezoelectric device 10A is the BAW resonator. An electrode formation method of the piezoelectric device 10A is different from that in the piezoelectric device 10. To be specific, functional conductors 231 and 232 are formed on the surface and the back surface of the piezoelectric thin film 20, respectively. Other elements of the piezoelectric device 10A are preferably the same as those of the piezoelectric device 10 and description thereof is therefore omitted.

Even when the piezoelectric device 10A is the BAW resonator, the formation positions of the functional conductors 231 and 232 are able to be adjusted efficiently by utilizing the alignment mark 50 in the manufacturing. When the piezoelectric device 10A is the BAW resonator, the electrodes (functional conductors 231 and 232) need to be provided on the surface and the back surface of the piezoelectric thin film 20, respectively. However, the positions of the functional conductors 231 and 232 are able to be adjusted with only one alignment mark 50.

Second Preferred Embodiment

Figure 8:
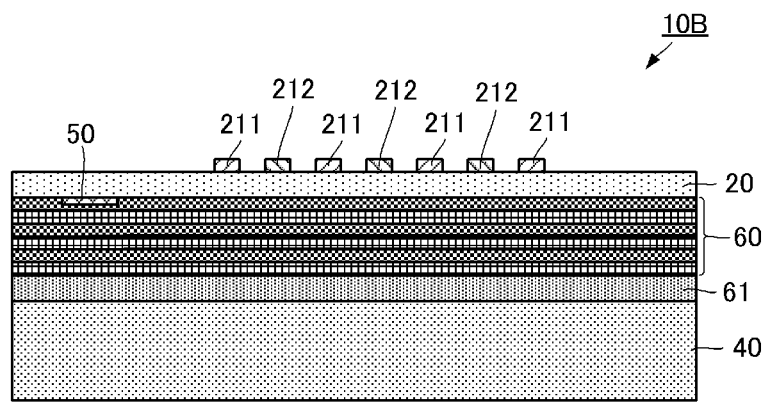
FIG. 8 is a cross-sectional side view illustrating the configuration of a piezoelectric device according to a second preferred embodiment of the present invention.

FIG. 8 is a cross-sectional side view illustrating the configuration of a piezoelectric device 10B according to a second preferred embodiment of the present invention. The piezoelectric device 10B according to this preferred embodiment is different from the piezoelectric device 10 in that the fixing layer 30 of the piezoelectric device 10 is defined by an acoustic reflection layer 60.

The acoustic reflection layer 60 is preferably formed by laminating a plurality of layers having different acoustic impedances. A low-acoustic impedance layer is preferably made of, for example, $SiO_2$ and a high-acoustic impedance layer is, for example, a metal layer made of W, Pt, or the like or a dielectric layer made of AlN, SiN, or the like. The acoustic reflection layer 60 is adhered to the support substrate 40 by an adhesive layer 61.

When the acoustic impedance layers are configured by the metal layers, patterning is preferably performed. Therefore, formation positions of the acoustic impedance layers are able to be adjusted relative to each other with reference to the alignment mark 50. Furthermore, even when the acoustic impedance layers are not configured by the metal layers, the patterning may be performed. When the patterning is performed, the formation positions of the acoustic impedance layers are also able to be adjusted relative to each other with reference to the alignment mark 50.

The alignment mark 50 is provided between the piezoelectric thin film 20 and the acoustic reflection layer 60. In the same manner as the first preferred embodiment, the formation positions of the functional conductors 211 and 212 are adjusted with reference to the alignment mark 50 in the manufacturing.

Figure 9:
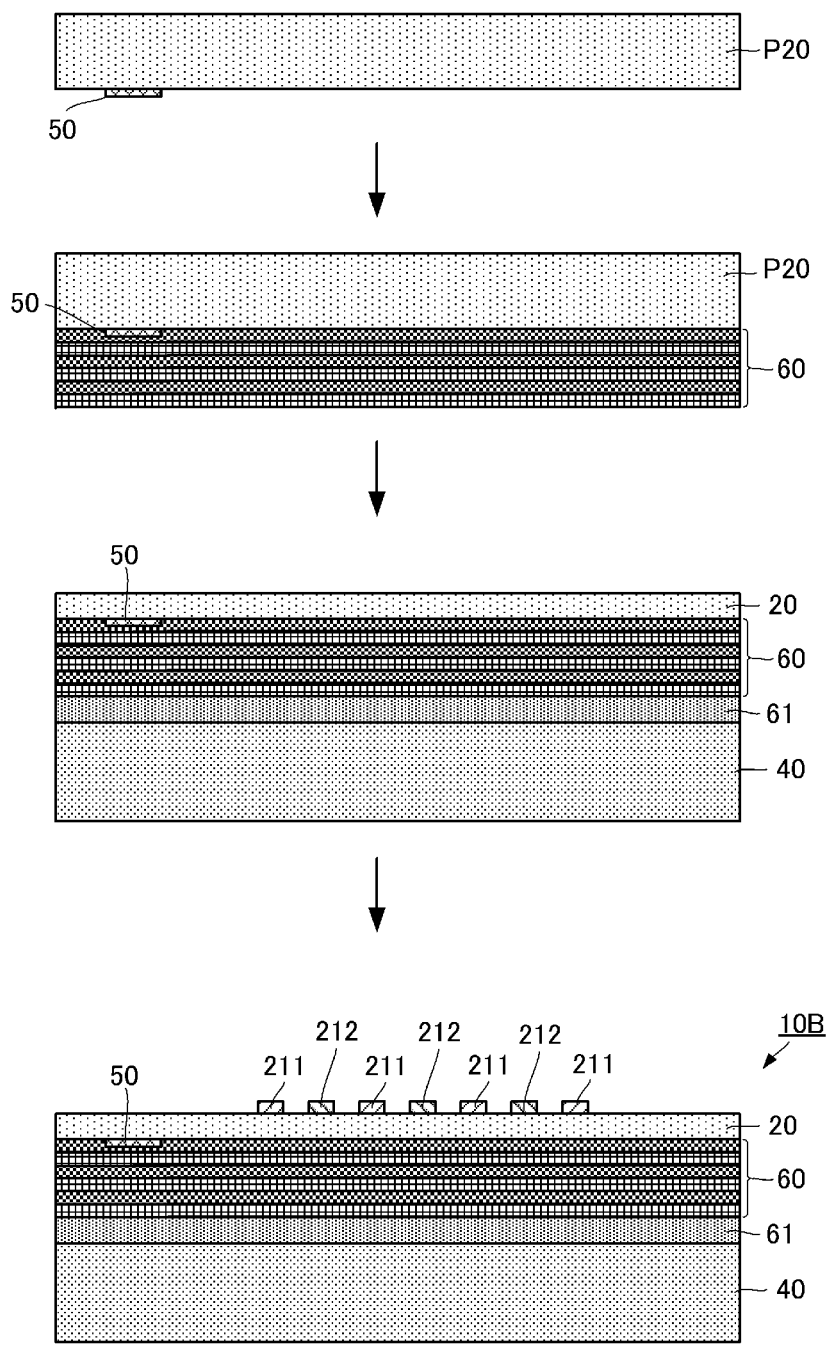
FIG. 9 is a cross-sectional side view illustrating shapes in respective processes in a method of manufacturing a piezoelectric device according to the second preferred embodiment of the present invention.

FIG. 9 is a cross-sectional side view illustrating shapes in respective processes in a method of manufacturing the piezoelectric device 10B according to a preferred embodiment of the present invention.

First, the alignment mark 50 is provided on the back surface of the light-transmitting piezoelectric substrate P20. A LiTaO$_3$ substrate or a LiNbO$_3$ substrate is preferably used as the piezoelectric substrate P20. The alignment mark 50 is film-formed by forming Ti/Al/Ti by the deposition lift-off method.

Then, the acoustic reflection layer 60 is provided on the back surface of the piezoelectric substrate P20 with reference to the alignment mark 50. The acoustic reflection layer 60 is preferably formed by laminating the low-acoustic impedance film and the high-acoustic impedance film, to be specific, laminating SiO$_2$ and AlN by, for example, about 100 nm to about 300 nm for each. The support substrate 40 is adhered to the surface of the acoustic reflection layer 60 at the opposite side to the piezoelectric substrate P20 by the adhesive layer 61.

The piezoelectric substrate P20 is preferably thinned by polishing or the like to form the piezoelectric thin film 20. The functional conductors 211 and 212 are provided on the surface of the formed piezoelectric thin film 20 by the deposition lift-off method. In this case, the functional conductors 211 and 212 are formed while positions thereof are adjusted with reference to the alignment mark 50.

The piezoelectric device 10B is preferably formed by using the above-described manufacturing method. The formation positions of the functional conductors 211 and 212 are able to be adjusted efficiently because the alignment mark 50 is utilized when the piezoelectric device 10B is manufactured.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
   a light-transmitting piezoelectric thin film;
   a functional conductor provided on the light-transmitting piezoelectric thin film;
   a support substrate at one main surface side of the piezoelectric thin film;
   a fixing layer fixing the piezoelectric thin film to the support substrate; and
   a region formation alignment mark provided between the piezoelectric thin film and the fixing layer and provided outside a formation region of the functional conductor at only a portion of the fixing layer or the support substrate when seen from above; wherein
   the functional conductor is provided on another main surface side of the piezoelectric thin film opposite to the one main surface side of the piezoelectric thin film at which the fixing layer, the region formation alignment mark, and the support substrate are provided; and
   the region formation alignment mark is entirely covered by the fixing layer.

2. The piezoelectric device according to claim 1, wherein
   the fixing layer includes a void portion provided between the formation region and the support substrate; and
   the region formation alignment mark is provided in an outer side portion of the void portion when seen from above.

3. The piezoelectric device according to claim 2, wherein the functional conductor is provided on each of one main surface and another main surface of the piezoelectric thin film.

4. The piezoelectric device according to claim 1, wherein the fixing layer is an acoustic reflection layer including a plurality of laminated layers with different acoustic impedances.

5. The piezoelectric device according to claim 1, wherein the functional conductor includes a pair of comb-teeth shaped portions which define an inter digital transducer.

6. The piezoelectric device according to claim 5, wherein the region formation alignment mark is outside the formation region of the functional conductor when seen from above and aligned with a wiring conductor electrically connected to one of the pair of comb-teeth shaped portions.

7. The piezoelectric device according to claim 1, further comprising through-holes defined in the light-transmitting piezoelectric thin film.

8. The piezoelectric device according to claim 7, wherein the through-holes are provided at an outer edge portion of the formation region of the functional conductor.

9. The piezoelectric device according to claim 1, wherein the region formation alignment mark includes projections which define a cross shape.

* * * * *